United States Patent [19]
Dalrymple et al.

[11] Patent Number: 5,153,509
[45] Date of Patent: Oct. 6, 1992

[54] SYSTEM FOR TESTING INTERNAL NODES IN RECEIVE AND TRANSMIT FIFO'S

[75] Inventors: Monte J. Dalrymple, Fremont; Lois F. Brubaker, Newark; Don Smith, Los Gatos, all of Calif.

[73] Assignee: Zilog, Inc., Campbell, Calif.

[21] Appl. No.: 654,326

[22] Filed: Feb. 12, 1991

Related U.S. Application Data

[62] Division of Ser. No. 194,857, May 17, 1988, Pat. No. 5,012,180.

[51] Int. Cl.⁵ ............................................. G01R 31/28
[52] U.S. Cl. ............................. 324/73.1; 324/158 R; 371/15.1; 371/22.1
[58] Field of Search ............... 324/158 R, 73.1, 158 T; 371/21.1, 21.2, 11.2, 15.1, 22.2, 22.6, 22.1; 437/8

[56] References Cited

U.S. PATENT DOCUMENTS

| | | | |
|---|---|---|---|
| 4,336,495 | 6/1982 | Hapke | 324/158 T |
| 4,667,330 | 5/1987 | Kumagai | 371/21.2 |
| 4,743,841 | 5/1988 | Takeuchi | 324/158 T |
| 4,744,061 | 5/1988 | Takemae et al. | 371/21.2 |
| 4,827,476 | 5/1989 | Garcia | 371/21.2 |
| 4,835,774 | 5/1989 | Ooshima et al. | 371/21.2 |

*Primary Examiner*—Vinh Nguyen
*Attorney, Agent, or Firm*—Majestic, Parsons, Siebert & Hsue

[57] ABSTRACT

A bus-oriented integrated circuit chip containing devices such as Receive and Transmit FIFO's further includes a testing circuit for testing normally inaccessible internal nodes in a FIFO device. The testing circuit includes test mode control register for storing the externally supplied test addresses of selected internal nodes of a FIFO device. A decoder, responding to a test command from a host microprocessor, selects the test addresses from the test mode control register and supplies them instead of other addresses to an internal address bus. A test decoder responds only to the test addresses on the internal address bus for enabling the transfer of data between the selected internal nodes and a data bus, thereby enabling bus access of the normally inaccessible internal nodes of a FIFO device.

4 Claims, 6 Drawing Sheets

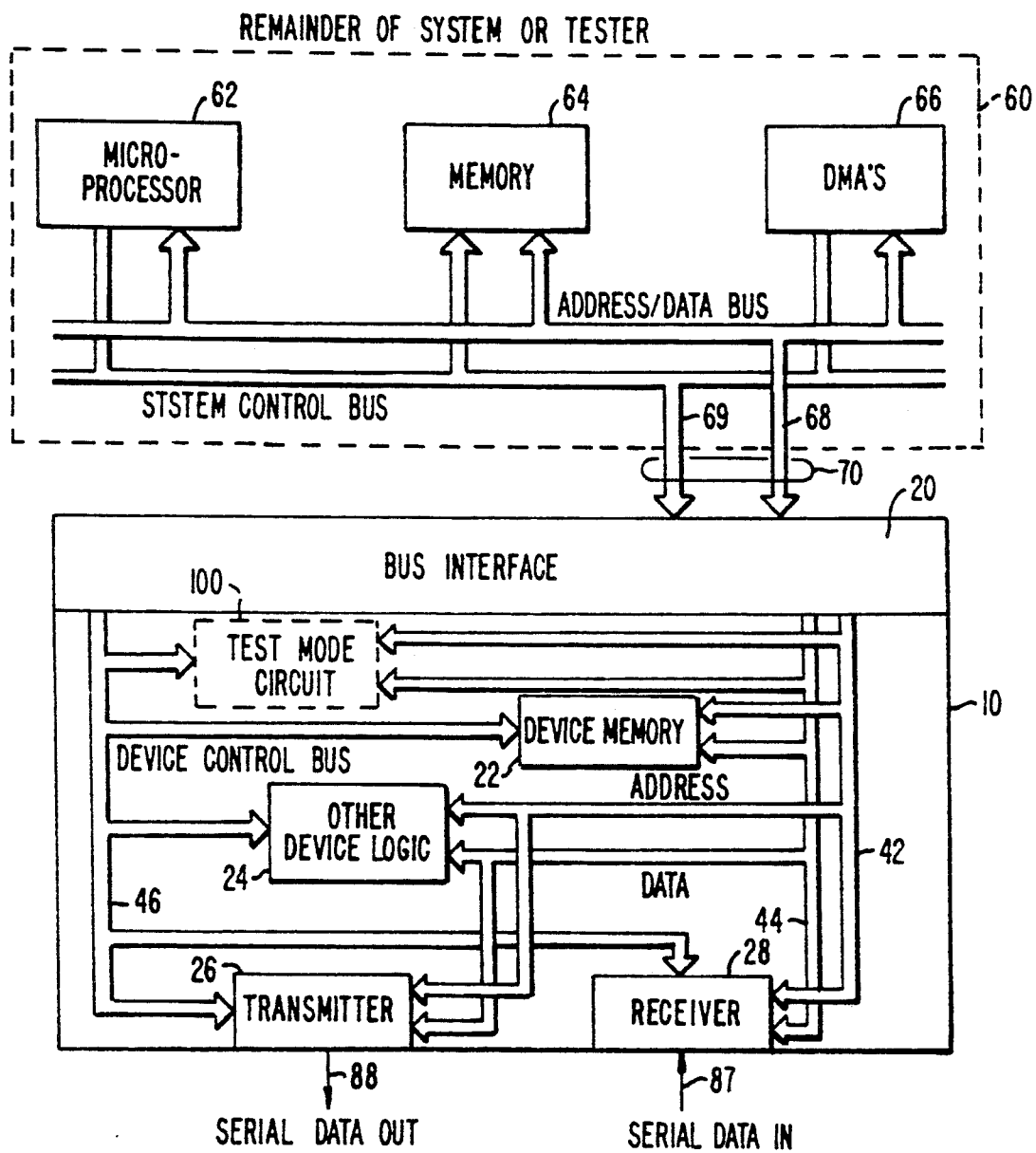
FIG._1.

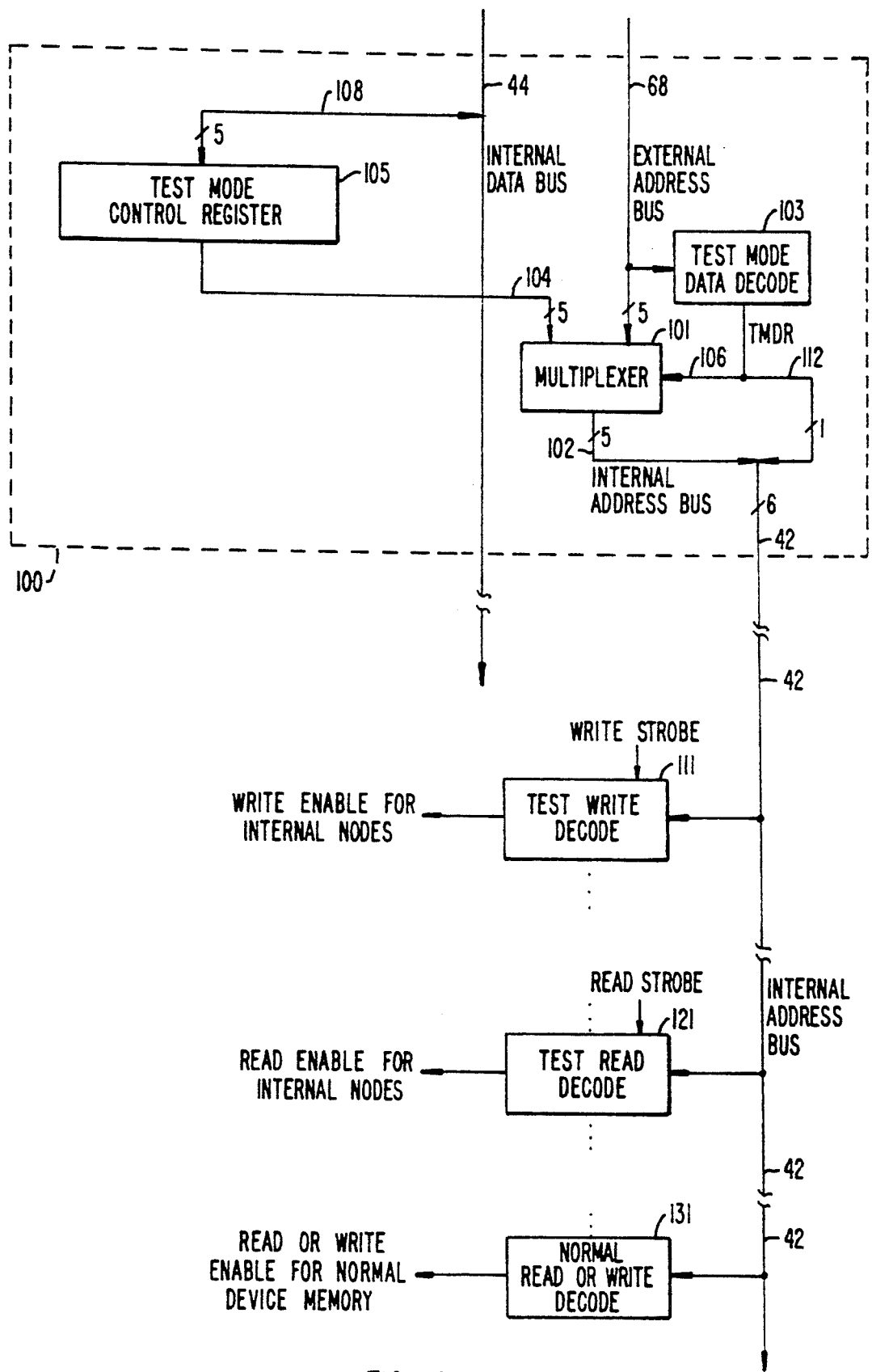
FIG._2.

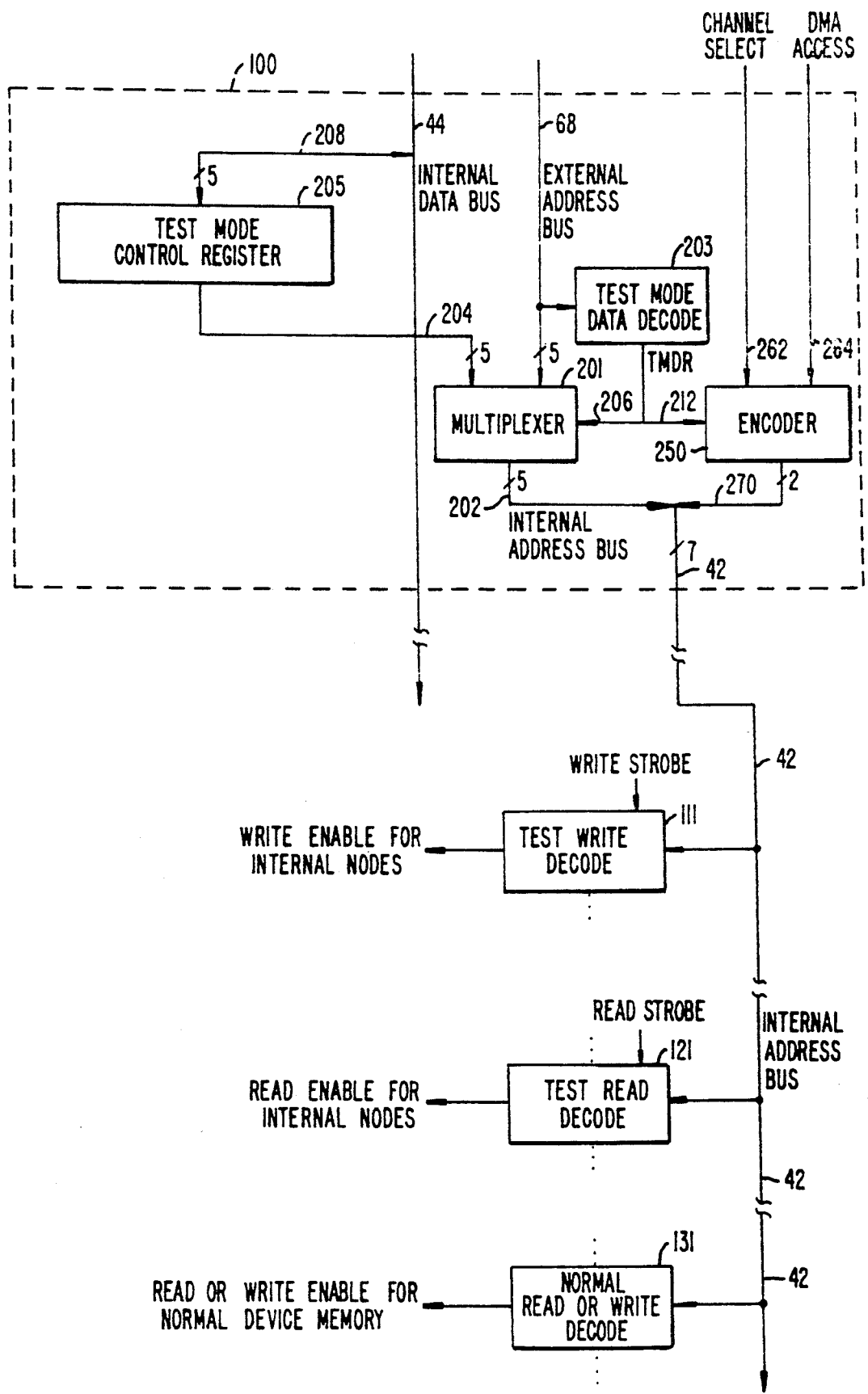
FIG._3A.

| INPUTS OF ENCODER | | | OUTPUTS | | INTERPRETATION |
|---|---|---|---|---|---|
| DMA ACCESS | CHANNEL SELECT* | TMDR | CHSEL1 | CHSEL0 | |
| (i) 1 | X | X | 0 | 0 | DMA DATA ACCESS |
| (ii) 0 | 0 | 1 | 0 | 1 | TEST MODE    ⎫ CPU BUS |
| (iii) 0 | 0 | 0 | 1 | 0 | NORMAL MODE ⎭ ACCESS |
| (iv) 0 | 1 | X | 1 | 1 | CHANNEL DESELECT |
FIG._3B.
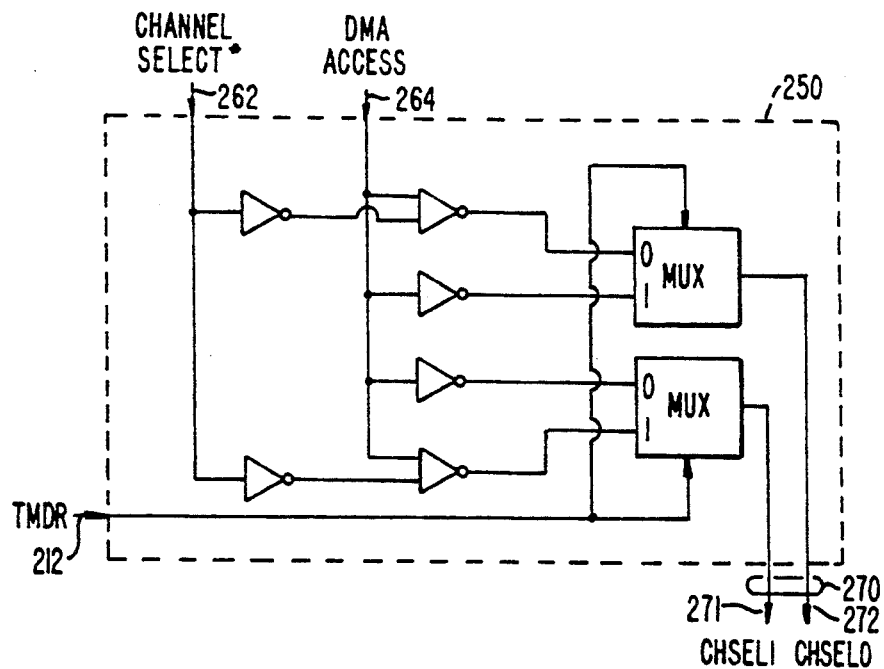
FIG._3C.

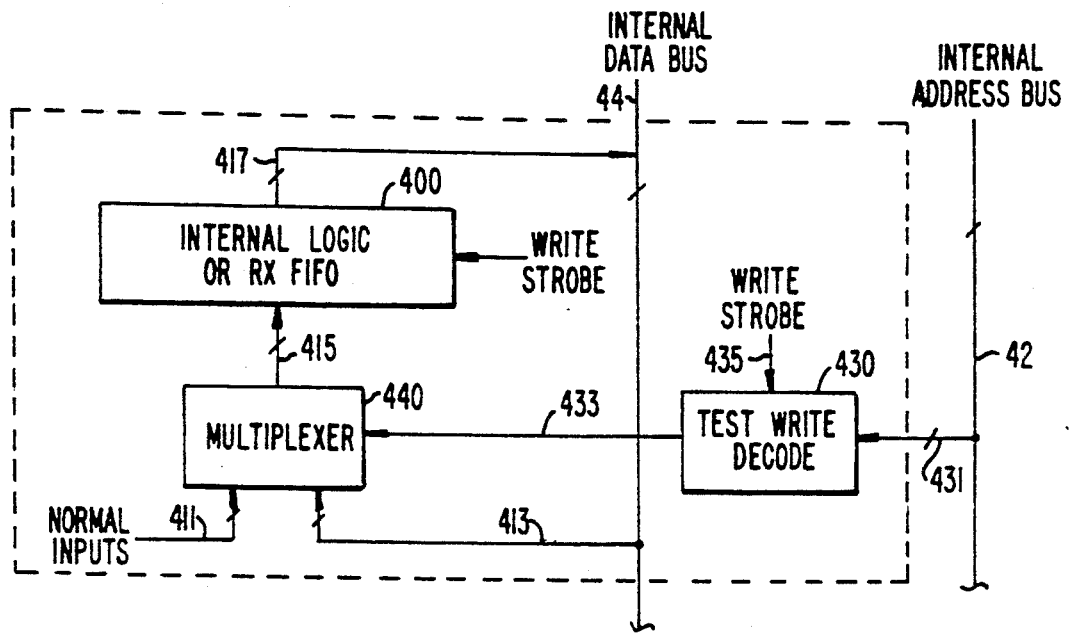
FIG._4.
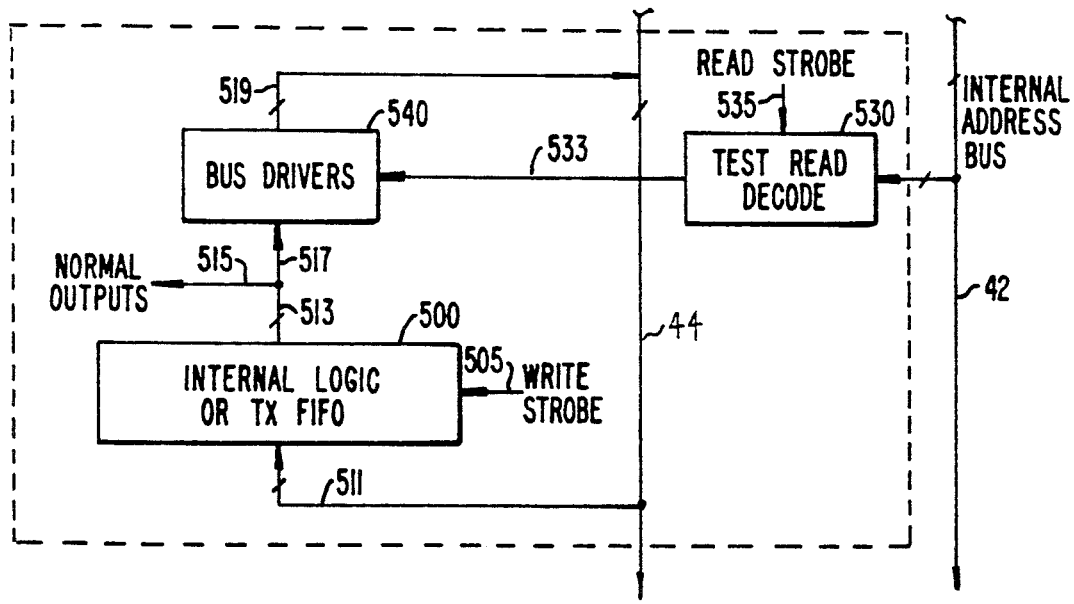
FIG._5.

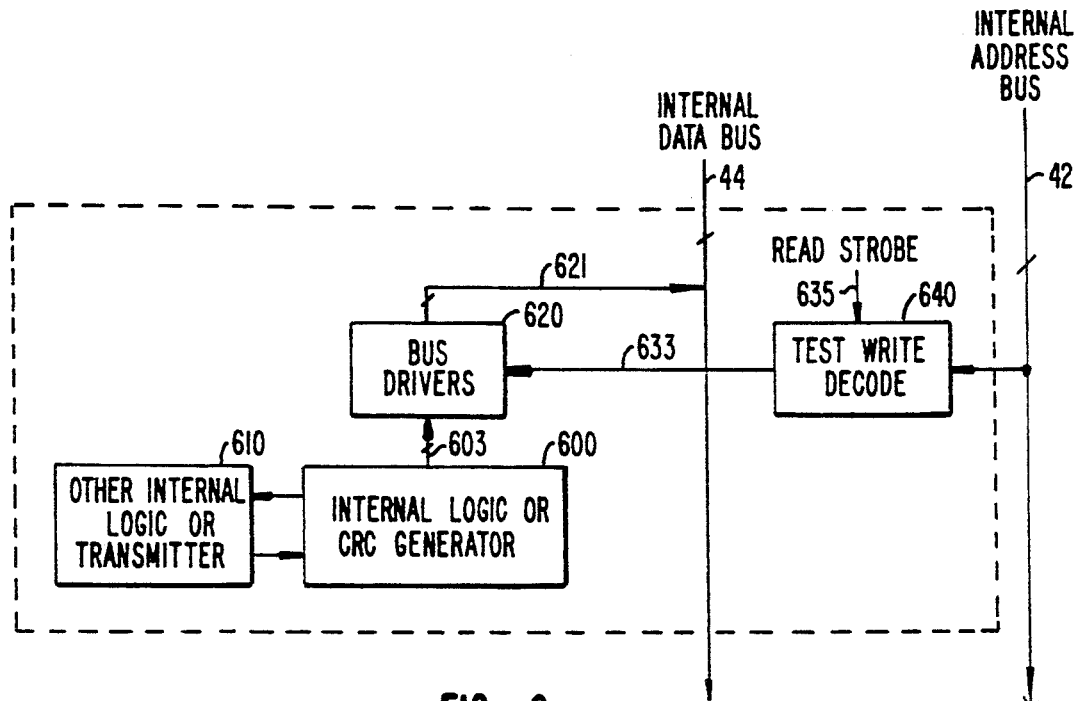
FIG._6.
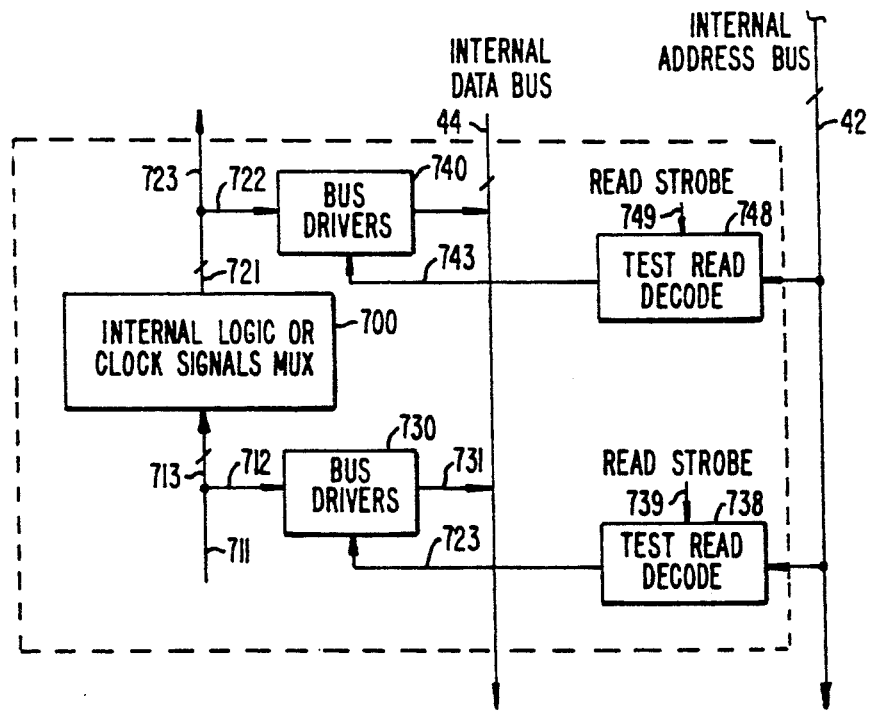
FIG._7.

SYSTEM FOR TESTING INTERNAL NODES IN RECEIVE AND TRANSMIT FIFO'S

This is a division of application Ser. No. 194,857, filed May 17, 1988, now U.S. Pat. No. 5,012,180.

BACKGROUND OF THE INVENTION

This invention relates in general to the testing and diagnostics of devices, and in particular to systems for testing of the internal nodes of devices.

A semiconductor integrated circuit (IC) is a very complex device. The circuit comprises a multitude of electronic components in a silicon chip. A microprocessor-based IC is frequently a Very Large Scale Integration (VLSI) component, with the number of internal logical components, typically transistors, ranging to more than 100,000. From the design of the IC to its final fabrication, a significant amount of time and effort is used for debugging the device. Testing and diagnostics are needed for design verification, for the checking of timing properties and for quality control in the fabrication process. In addition, testing and diagnostics allow more accurate information to be obtained about the actual performance of a device. Among other things, they allow easier design upgrades to be made to a device.

The IC is usually packaged with a limited number of external pins which are connected internally to the inputs or outputs of the IC chip in order to perform a variety and sometimes large number of functions. Because of the limited number of pins, often it is difficult to exhaustively test nodes buried within a circuit, particularly in the case of embedded state machines. Several methods are commonly used. One way is to use an IC tester for inputting special input sequences that must be followed in order to get certain designated internal nodes into specific test states, and to observe the effect as they propagate to the output pins. These test sequences are typically very different for different ICs and in some cases the IC cannot be driven to the state necessary for some types of tests. In the cases where the IC can be driven to the proper state, the input sequence necessary cannot be generated without using expensive and dedicated IC test equipment. Also the process is very time consuming when checking critical timing of the circuit, since the test sequences must be finely divided (micro-sliced) in order to resolve the timing difference.

Certain components in an integrated circuit are particularly difficult to test. Thus, typically the only way to write test data to a FIFO embedded within the receiver to a serial communications device is via a serial bit pattern which must be encoded in one of the established protocols recognized by the device. The data is then internally decoded and shifted onto a parallel bus before being loaded into the FIFO. Similarly, reading from the FIFO of a transmitter usually involves loading data into a shifter, serializing it, and encoding it into recognized data protocol. The output is a serial bit pattern. Designing a serial pattern for a tester, decoding and encoding, and shifting the data through the FIFO are all time consuming during testing of the device. The encoding and decoding make preparing the test patterns a long process.

One way of testing the internal nodes in a device is to use microprobing techniques which are slow, piecemeal and require expensive equipment.

Another common method of testing the internal nodes related to such embedded state machines is disclosed in U.S. Pat. No. 4,441,075 issued to M. T. McMahon, U.S. Pat. No. 4,494,066 issued to P. Goel et al. and U.S. Pat. No. 4,504,784 issued to P. Goel et al. The method is to include extra logic at the inputs of all flip-flops in the IC that, in test mode, forms a long shift register out of these flip-flops. Data is then shifted serially through this shifter to exercise the random logic between the flip-flops. This obviously takes a significant amount of time and does not make use of existing hardware such as the parallel bus interface on a bus oriented device.

U.S. Pat. No. 4,677,586 issued to Magar et al. discloses various test modes for a microprocessor IC chip. In one example, the internal problem in the ROM may be read out on the data bus, one opcode at a time, for test purposes without executing the opcodes. The test mode is triggered by an abnormally high voltage forced onto one of the input pins of the device. This disables normal functions and allows a dump of the contents in the normally inaccessible ROM onto the data bus.

Accordingly, it is a primary object of the invention to provide improved accessibility to the internal nodes via the bus of an IC device under test mode.

It is another object of the invention to provide addressibility to certain sets of internal nodes which are to be accessed.

It is yet another object of the invention to provide a test mode which selects alternative paths for reading data from an addressed set of internal nodes while allowing for the normal functioning of the device.

It is yet another object of the invention to provide a test mode which selects alternative paths for writing test data to an addressed set of internal nodes while allowing for the normal functioning of the device.

SUMMARY OF THE INVENTION

One aspect of the invention is directed to a circuit for use in a device for testing internal nodes in the device. The circuit comprises means responsive to a first signal for initiating a test mode and generating a second signal and means responsive to the second signal for enabling the reading of data for testing from selected ones of a plurality of internal nodes of the device onto a bus accessible from outside the device or the writing of test data from the bus to selected ones of a plurality of internal nodes. The second signal indicates the addresses of the internal nodes selected and the enabling means enables the reading or writing of data only for the selected internal nodes whose addresses are indicated by the second signal.

According to another aspect of the invention, during the test mode, the internal nodes whose addresses are not indicated by the second signal are not affected so that operations other than testing can be performed at such nodes. Even at the internal nodes of the device from which data is read for testing, operations other than testing are performed at such nodes during the test mode. For this reason, the device can be tested with minimal impacts on its speed. The bus which is used for selecting the internal nodes for testing will be occupied for testing only for a read cycle in the preferred embodiment; even during this read cycle, operations of the device not requiring the bus can be performed without interruption.

According to another aspect of the invention, the existing hardware is made use of to minimize the components required for testing and internal nodes. Such aspect of the invention is directed towards a circuit for use in a peripheral device for testing internal nodes in the device. The device is in communication with a microprocessor through an address bus and a data bus where the device has at least one decoder which decodes an address in the address bus for enabling the transfer of data between internal nodes indicated by the address and the data bus. The testing circuit includes storage means for storing test addresses of selected internal nodes in the device and means responsive to a test command from the microprocessor for selecting the test addresses from the storage means instead of other addresses and for supplying the test addresses to the address bus in place of other addresses supplied to the address bus. The testing circuit further includes test decoder means responsive only to the test addresses on the address bus for enabling the transfer of data between the selected internal nodes and the data bus for testing the selected internal nodes.

According to yet another aspect of the invention, a circuit for testing a receive FIFO is provided where the FIFO receives data from a source and supplies the data received to a data bus. The circuit comprises means for supplying test data to the FIFO and means responsive to a test command for selecting between test data from the supplying means and data from the source for entry to the FIFO so that when said selecting means receives a test command, the selecting means selects the test data to be written to the FIFO and when the selecting means receives no testing command, the selecting means selects the data from the source to be written into the FIFO. The circuit further comprises means for reading the test data in the FIFO onto the data bus for testing the FIFO.

One another aspect of the invention is directed towards a circuit for testing a transmit FIFO where the FIFO receives data from a data bus and supplies the data received to a transmitter through an output. The circuit comprises means for supplying the output data to the data bus for testing the FIFO wherein the testing means includes means for driving the output of the FIFO to the data bus.

The various aspects of the present invention described herein are being commercially embodied in the Z16C30 CMOS Universal Serial Controller integrated circuit chip of Zilog, Incorporated, Campbell, Calif., assignee of the present application.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 1 is a block diagram of an example system in which the various aspects of the present invention are applied.

FIG. 2 is a block diagram of an alternate embodiment of the invention.

FIG. 3A is a block diagram illustrating the preferred embodiment of the invention.

FIG. 3B is a Truth Table illustrating the encoding scheme of the encoder of FIG. 3A.

FIG. 3C is a schematic circuit diagram of the encoder of FIG. 3A.

FIG. 4 is a block diagram illustrating a circuit by which test data are written into certain nodes of an internal logic block.

FIG. 5 is a block diagram illustrating a circuit by which the states of certain nodes of an internal logic block are read out by the bus under test mode.

FIG. 6 is another block diagram illustrating a circuit by which the states of certain nodes of an internal logic block are read out to the bus.

FIG. 7 is a block diagram illustrating a circuit by which data going into and coming out of an internal logic block are read out to the bus.

DETAILED DESCRIPTION OF THE PREFERRED EMBODIMENT

An example selected to illustrate the various aspects of the present invention is a peripheral chip referred to as the Universal Serial Controller. The peripheral chip is a bus-oriented IC chip and is used in a microprocessor system to convert between parallel data and serial data. Referring to FIG. 1, the architecture of the peripheral chip 10 is shown in block diagram form. A bus interface 20 connects internally to a device memory 22, other device logic 24, a transmitter 26 and a receiver 28 by means of a set of internal buses. The set of internal buses consists of internal address bus 42, data bus 44 and device control bus 46. The peripheral chip 10 forms part of a microcomputer system of which the rest of the system 60 usually comprises a microprocessor 62, a memory 64 and DMAs 66, all of which are interconnected by a system bus 70. The system bus 70 usually includes address/data bus 68 and system control bus 69. The address/data bus 68 may be a multiplexed bus or may be separate address and data buses. The USC chip 10, through its bus interface 20, is connected to the rest of the system 60 by means of system bus 70.

when the peripheral chip 10 is subjected to testing, the rest of the system 60 may also assume the form of a tester which is microprocessor-controlled and is likely to contain the same basic components mentioned earlier.

As mentioned before, the peripheral chip serves to convert between parallel data and serial data. Schematically, parallel data from the system bus 70 enters or leaves the peripheral chip through the bus interface 20, and the serial data exits the peripheral chip through a line 88 and enters through a line 87. The peripheral chip 10 illustrated in FIG. 1 is, of course, packaged in some appropriate way (not shown) with conductive pins extending from the package and connected to the circuit chip.

One important feature of the present invention is the implementation of a test mode circuit in a bus oriented IC chip. As shown in FIG. 1, the test mode circuit is schematically shown as a block 100 residing within the peripheral chip 10. The test mode circuit 100 is connected externally to the system bus 70 via device bus interface 20, and internally connected to the various device components by means of internal buses 42, 44, and 46.

The peripheral chip 10 shown in FIG. 1 is an example of a bus-oriented IC chip. Information exchange between device components within the chip as well as between the chip and the rest of the system 60 is effected through a set of internal and external system buses respectively. Typically, the peripheral chip 10 contains a device memory 22 which is accessible through the buses. For example, in a typical write cycle, the microprocessor 62 puts the address of a particular device memory 22 on the address bus 42 and makes available data on the data bus 44. By issuing a control strobe signal through the device control bus 46, the data on data bus 44 is latched into the particular device memory 22. Similarly for a read cycle, the microprocessor 62 puts the address of a particular device memory 22 onto address bus 42 and issues a strobe signal through the device control bus 46 to latch the data in the particular device memory onto the data bus 44.

While the contents of the device memory 22 are normally accessible through the bus, there is normally no provision for accessing the internal nodes residing elsewhere in the device such as in the other device logic 24, the transmitter 26 or the receiver 28. This invention is based on the observation that when the device is being debugged or under test, the testing operations are greatly simplified when some critical internal nodes are directly accessible for external stimulation and interrogation. The invention allows for direct access to these internal nodes via the bus in the same manner as the normal bus access to the device memory 22 described earlier.

FIG. 2 shows schematically one embodiment of the test mode circuit 100 in more detail. For the purpose of illustration, the external address bus 68 is taken to be 5-bits wide. This will provide $2^5$ difference addresses for the device memory 22. In order to accommodate extra addresses for the additional internal nodes for the purpose of testing, an extra line is added to the internal address bus 42 to make it a 6-bit wide bus.

Under the normal operation of the device, in a read or write cycle, the microprocessor will put the 5-bit address of a particular device memory onto the external address bus 68. This will be connected to five of the lines 102 of the 6-bit internal bus 42 by means of a multiplexer 101. Under normal conditions the 6th bit of the internal address bus is at default Zero. This acts as a device memory select so that only the set of normal device memory will be addressed. The other 5-bit address serves as a pointer to a particular device memory. That is, the address decoder 131 associated with it will be decoded by the address and the output of the decoder 131 is used to enable the latching of data to or from the particular device memory.

One particular address of the 5-bit external address space is reserved to trigger the device into a test mode. Thus to enter the test mode, the microprocessor puts this address on the external address bus 68 to trigger the test mode. This is decoded by a test mode data decoder 103 and makes its output TMDR High. This signal is asserted along two paths. In one path it controls the multiplexer 101 through an input 106 and switches five of the lines 102 of internal address bus 42 onto the lines 104 connecting to a test mode control register 105. Test mode control register 105 contains the partial 5-bit address for the set of addressable internal nodes.

The other path of the output of test mode data decoder 103 goes along line 112 and combines with the 5-bit internal address bus 102 to form the 6th bit of internal address bus 42. Thus, in contrast to the normal case, under test mode, the 6th bit is at an active One. This acts as an internal node select so that only the set of internal nodes addressable for testing will be addressed. Thus, only those test address decoders like 111 or 121 will be responsive to those internal addresses whose 6th bit is a One. Thus, certain particularly critical internal nodes are connected to decoders such as test decoders 111 and 121 and to the internal data bus so that these nodes can be accessed for testing. For example, test write decode 111 may point to a particular set of internal nodes. When the test address for this particular set of internal nodes from the test mode control register 105 is decoded by decoder 111, decoder 111 will generate a write enable signal when prompted by a a write strobe from the microprocessor. This write enable signal enables the writing of data from internal data bus 44 into the particular set of internal nodes. Similarly for reading from a particular set of internal nodes, the address for such set of nodes is decoded by a decoder such as test read decoder 121, and when a read strobe is issued by the microprocessor, decoder 121 generates a read enable signal to read the states of such internal nodes onto internal data bus 44.

The addresses for the internal nodes selected for testing are to be obtained from the test mode control register 105. The addresses are normally fed by the microprocessor before the device enters the test mode. The test mode control register 105 is just one of the device memories which the microprocessor can write to by normal bus access as described earlier. Thus it will have the usual address decode and write strobe line (not shown). In FIG. 2 is illustrated the data path 108 by which the microprocessor puts the address of a particular set of internal nodes from the internal data bus 44 into test mode control register 105.

The above described scheme has a number of advantages. By writing in the appropriate addresses in the test mode control register 105, the critical internal nodes having such addresses can be tested. Since the addresses written into register 105 can be easily changed from outside the device, the user can choose which particular internal nodes to test, assuming that such internal nodes are provided with test decoders such as decoders 111 and 121 for enabling such nodes to be accessed for the purpose of testing.

The above described scheme is also advantageous since it makes use of the internal data and address buses which are already present in the bus interface and in the peripheral device. The added components, namely the test mode control register 105, the test mode data decoder 103, multiplexer 101, test write decoder 111 and test read decoder 121 simply cooperate with the existing hardware already in place for the purpose of testing selected internal nodes. The scheme described is therefore advantageous over certain prior art testing schemes which do not make use of existing hardware and require extensive additional extra logic to accomplish the purpose of testing.

Yet another advantage of the scheme described is to permit testing of the device without interfering with much of the functions of the device so that the speed of the device is only minimally affected. In reference to FIG. 2, the only portion of the peripheral chip 10 affected by the testing are the internal nodes actually tested. Even among the internal nodes which are being tested, as long as no test data is written to such nodes, normal non-testing operations can still proceed at such nodes, so that the only nodes at which operations are affected are limited to those to which testing data is written. While the internal address bus 42 is switched by multiplexer 101 to connect to test mode control register 105 in order to gain access to the desired internal nodes, the internal address bus is occupied for this purpose only for one read cycle. After such cycle, the internal address bus is again connected to the external address bus for performing functions other than testing. Even during the cycle when the internal address bus is occupied for the purpose of testing, other functions of the peripheral chip not requiring the internal address bus can continue without interruption. This is not true, for example, in the scheme described by Magar et al. in U.S. Pat. No. 4,677,586 where all normal functions are disabled during the test mode.

In addition to the test and normal device memory access functions described above, other associated functions important for a peripheral such as the peripheral chip will be described below in reference to FIGS. 3A–3C which illustrate the preferred embodiment of the invention. In one such important function, when a whole block of memory is to be transferred at a time, many systems have provision for transfer of data by Direct Memory Access (DMA) without requiring the attention of the microprocessor. In a peripheral device such as the peripheral chip, DMAs are used to manage the transfer between the system memory on the one hand, and device Receive (Rx) or Transmit (Tx) FIFOs on the other hand.

Also the peripheral chip has two channels so that the chip can do two independent serial to parallel or parallel to serial processings. Each channel has a Channel Select* line which at default Zero will enable that particular channel and at a One will deselect it.

In the preferred embodiment shown in FIG. 3A, the test mode option, the DMA Access Option and the Channel Select Option are incorporated into a partial two bit internal address system. Thus, the 6th bit of the embodiment described in FIG. 2 is replaced by a 6th and 7th bit. FIG. 3A is similar to FIG. 2 except for the incorporation of an extra encoder 250. The encoder 250 has three inputs. These are: TMDR which is the output of the test mode data decoder 203, Channel Select* and DMA Access. The output of encoder 250 is a two bit address carried along lines 270. These two lines 270 are combined with the five lines 202 of the internal address bus to form a 7-bit internal address bus 42.

The Truth Table showing the coding scheme of encoder 250 is shown in FIG. 3B. Referring to case (i), when DMA Access is an active One, irrespective of the states of Channel Select* and TMDR, the two address lines 271, 272 carrying signals CHSEL1 and CHSEL0 will both carry state Zero. This address will be decoded by the device and will initiate the transfer of data between the device FIFO and the system memory under DMA control. Cases (ii–iv) correspond to the situation when there is no DMA Access (DMA is at inactive Zero). In addition, in cases (ii) and (iii), the particular channel is selected (Channel Select* is Zero). In case (ii) the test mode is also selected (TMDR is active One) and results in a coding of CHSEL1 as Zero and CHSEL0 as a One. These two lines in combination with the five lines 202 of the internal address bus provide the addresses for the various internal nodes of the device. In case (iii), the test mode is not selected (TMDR is Zero). This gives rise to a normal mode coding of a One for CHSEL1 and a Zero for CHSEL0. This in combination with the five lines 202 of internal address bus provide the addressing of the normal device memory. Finally, for case (iv) another channel is selected (Channel Select* is One). This gives rise to a One for both CHSEL1 and CHSEL0, and the channel not selected.

FIG. 3C is a circuit realization of the Truth Table of FIG. 3B.

The peripheral chip used to illustrate the various aspects of the invention is a peripheral device which converts between parallel data suited for a microprocessor and serial data suited for transmission over a single line to other devices. Usually the peripheral device employs Receive (Rx) FIFO and Transmit (Tx) FIFO to time-buffer the disparate rates of parallel and serial data transfer.

EXAMPLE I

As discussed above, conventional methods of testing FIFO's are unsatisfactory. This invention allows quick testing of FIFO's. In the peripheral chip, an internal logic block usually obtains data from a normal input path. The invention allows the internal logic block under test mode, to receive data from the internal data bus instead. In the peripheral chip, one such internal logic block is a Receive (Rx) FIFO. Referring to FIG. 4, the internal logic block or Rx FIFO 400 normally receives through its input 415 from normal input 411 parallel data from a shifter which shifts received serial data into parallel form. When the Rx FIFO is sufficiently filled, a whole block of parallel data is transferred out of the FIFO 400 through lines 417 and internal data bus 44 into a system memory under the control of a DMA. In conventional methods of testing the FIFO, normally the only way a block of test pattern data is loaded into the FIFO is to send a serial bit pattern through the receiver. The serial bit pattern must first be encoded in one of the established protocols recognized by the device. The data is then internally decoded and shifted onto a parallel bus to form the desired test patterns when loaded into the Rx FIFO. Dealing with the serial patterns at the tester, decoding and encoding, and shifting the data are all time-consuming during the testing of the device. Additionally, the encoding and decoding make preparing the test patterns a long process.

One aspect of the present invention allows a block of test pattern data to be loaded directly into the Rx FIFO 400 without the time consuming process of first encoding a serial bit pattern. According to the scheme described for the circuits of FIG. 2 or FIG. 3A, the address corresponding to the Rx FIFO 400 is decoded by test address decode 430. At the same time the microprocessor puts the test pattern data on the internal data bus 44. It then issues a write strobe to enable test address decode 430 through input line 435. This results in an active decode signal on line 433 which is used to switch a multiplexer 440 such that the Rx FIFO takes it input from the internal data bus 44 via lines 413 instead of from the normal inputs 411. In this way, test data may be loaded into the Rx FIFO directly through the internal data bus. The test data loaded in the FIFO are read out onto the internal data bus as in normal operations for testing the FIFO.

EXAMPLE II

FIG. 5 shows the test situation where the output nodes of an internal logic block or a Tx FIFO need to be examined. Specifically for a Tx FIFO, every time the write strobe 505 is active, parallel data is transferred from the system memory through the internal data bus 44 and input lines 511 into the FIFO 500. The output 513 of the FIFO 500 normally goes to the normal output 515 which enters a shifter whereby the parallel data are shifted into serial form (not shown). Under a test condition, a test pattern may be sent to the Tx FIFO 500 via the internal data bus 44 and input lines 511. The test pattern as it comes out of the Tx FIFO in parallel form may be examined directly by tapping the output lines 513 with the internal data bus 44. This is done by means of bus drivers 540 which when enabled, drive the outputs on lines 513 via lines 517 and lines 519 onto the internal data bus 44. The bus driver 540 is selectively enabled via input line 533 which is connected to the output of a test address decode 530. Similar to the cases described earlier, the test address decoder 530 issues an enabling signal through line 533 whenever it is selected by the appropriate internal address in combination with an active read strobe through line 535.

In this way the reading of test patterns from the FIFO of a transmitter need not involve loading the test data into a shifter, serializing it, and encoding it into a recognized data protocol.

EXAMPLE III

Example III is similar to example II in that it allows bus reading of normally inaccessible internal nodes. In this particular case the internal nodes do not form part of any input or output path to the component associated with it. For the case of the peripheral chip, an example of such an internal logic would be a Cyclic Redundance Check (CRC) generator. The CRC generator is an error detecting device commonly used in communications transmission systems. CRC generators are customarily implemented in a multi-section shift register which feeds into an exclusive-OR gate whose output feeds back to the other exclusive-OR gate located in between the sections of the shift register. As the bits get shifted on through the segments of the shift register during the transmission of subsequent bits, they will eventually reach some of the exclusive-OR gates between the segments of the shift register. There they will affect the state of the "feedback bits" going from the exclusive-OR gate to the input side of the shift register. The general effect to be recognized is that the effect of any bit is reflected in the various bits of the shift register for considerable time after that bit is transmitted. The CRC generator is usually incorporated into the shift register within the transmitter of the peripheral device. Normally, in order to test the CRC generator, the serial patterns coming out of the transmitter must be analyzed. Apart from the inconvenience of having to deal with an encoded serial bit pattern, the long-term effect of any bit in the CRC generator necessitates consideration of a lengthy serial bit stream.

FIG. 6 illustrates schematically a CRC generator 600 as part of a transmitter 610. The invention enables the tapping of the internal nodes 603 of the CRC generator 600 by means of the internal data bus 44 via bus drivers 620 and lines 621. Bus driver 620 is enabled whenever an active signal in line 633 is decoded by a test address decode 640. This happens whenever test address decode 640 is selected by the appropriate internal address in conjunction with an active read strobe in line 635. Thus, it is possible to monitor the state of various internal nodes through the internal data bus.

EXAMPLE IV

In this example, the invention allows tapping of the signal going into an internal logic and tapping of the signal coming out of the same internal logic by means of the internal data bus. In the USC chip, one such internal logic would be a Clock Signals Multiplexer where many different clock signals enter the multiplexer and get switched to different outputs. When testing such a complex switching circuit, it is expedient to be able to monitor what is going into the multiplexer and what is coming out of the multiplexer. Referring to FIG. 7, an internal logic or a Clock Signals Multiplexer 700 normally has lines 711 feeding into its input 713 and lines 723 connecting to its outputs 721. When the proper address is decoded at test address decode 738 in combination with a read strobe in line 739, a decoded signal in line 733 enables bus drivers 730 which make the signals appearing in lines 711 also available on the internal data bus 44. Similarly, when the appropriate address is decoded by test address decoder 748 in combination with a read strobe in line 749, the decoded signal in line 743 enables bus drivers 740 which make the signals coming out of the multiplexer 700 in lines 723 also available on the internal data bus 44. Thus, it is possible to monitor the data going into and out of an internal logic through the internal data bus.

The present invention has been described in its application to the testing of internal nodes within a peripheral chip. It will be understood, however, that the invention is equally applicable for testing the internal nodes of any device. While it is most convenient to provide a register for storing the addresses of the internal nodes to be tested so that the addresses can be written into the register before the initiation of the test mode, other means of generating the addresses may be used. Such details and implentation and method are within the scope of the invention, it being understood that the invention is to be protected within the scope of the appended claims.

We claim:

1. In an integrated circuit device having internal data and address buses respectively connectable to external data and address buses, the integrated circuit device also having a FIFO with an input for receiving data and an output connected to the internal data bus for sending the data received thereto, said FIFO input being normally inaccessible from outside the integrated circuit device, a circuit included in the integrated circuit device for testing the FIFO comprising:

a test write decode means responsive to an address of the FIFO input from the internal address bus for providing a control signal;

a first multiplexer means responsive to the control signal for connecting the input of the FIFO to an input source to normally receive data therefrom when the control signal is not being provided, and connected to the internal data bus to receive test data therefrom when the control signal is being provided, thereby allowing the normally inaccessible input of the FIFO to be accessible from outside the device.

2. The circuit for testing the FIFO as in claim 1, wherein the address of the FIFO input is obtainable from a test mode means, said test mode means comprising:

a test mode decode means responsive to an address from the external address bus for outputting a test mode control signal to set the integrated circuit device in either a normal state or a test mode state, the normal state resulting from the address from the external address bus being one of a plurality of normal addresses and the test mode state resulting from the address from the external address bus being a predetermined address for initiating a test mode;

a test mode control register means for storing the address of the FIFO input, the address of the FIFO input being obtainable from the internal data bus; and a second multiplexer means responsive to the test mode control signal for connecting the internal address bus to the external address bus to receive the one of the plurality of normal addresses when in the normal state, and connecting to the test mode control register means to receive the address of the FIFO input when in the test mode state, thereby allowing the address of the FIFO input to be obtainable from the internal bus during the test mode state.

3. In an integrated circuit device having internal data and address buses respectively connectable to external data and address buses, the integrated circuit device also having a FIFO with an input from the internal data bus for receiving data therefrom and an output for sending the data received, said FIFO output being normally inaccessible from outside the integrate circuit device, a circuit included in the integrated circuit device for testing the FIFO comprising:

a test read decode means responsive to an address of the FIFO output from the internal address bus for providing a control signal;

a first multiplexer means responsive to the control signal for connecting the output of the FIFO to a normal output to transmit data thereto when the control signal is not being provided, and connected to the internal data bus to transmit test data thereto when the control signal is being provided, thereby allowing the normally inaccessible output of the FIFO to be accessible from outside the device.

4. The circuit for testing the FIFO as in claim 3, wherein the address of the FIFO output is obtainable from a test mode means, said test mode means comprising:

a test mode decode means responsive to an address from the external address bus for outputting a test mode control signal to set the integrated circuit device in either a normal state or a test mode state, the normal state resulting from the address from the external address bus being one of a plurality of normal addresses and the test mode state resulting from the address from the external address bus being a predetermined address for initiating a test mode;

a test mode control register means for storing the address of the FIFO output, the address of the FIFO output being obtainable from the internal data bus; and a second multiplexer means responsive to the test mode control signal for connecting the internal address bus to the external address bus to receive the one of a plurality of normal addresses when in the normal state, and connecting to the test mode control register means to receive the address of the FIFO output when in the test mode state, thereby allowing the address of the FIFO output to be obtainable from the internal bus during the test mode state.

* * * * *

UNITED STATES PATENT AND TRADEMARK OFFICE
CERTIFICATE OF CORRECTION

PATENT NO.    :    5,153,509
DATED         :    OCTOBER 6, 1992
INVENTOR(S)   :    MONTE J. DALRYMPLE, LOIS F. BRUBAKER, DON SMITH

It is certified that error appears in the above-identified patent and that said Letters Patent is hereby corrected as shown below:

```
Column 11, line 21, in Claim 3        replace "integrate"
                                      with ---integrated---
```

Signed and Sealed this

Sixteenth Day of November, 1993

Attest:

BRUCE LEHMAN

*Attesting Officer*   *Commissioner of Patents and Trademarks*